US005784290A

United States Patent [19]
Kung et al.

[11] Patent Number: 5,784,290
[45] Date of Patent: Jul. 21, 1998

[54] MULTI-CHIP DEVICE PARTITIONING PROCESS

[75] Inventors: David Shing-Ki Kung, Chappaqua; Lakshmi Narasimha Reddy, Poughkeepsie, both of N.Y.

[73] Assignee: International Business Machines Corporation, Armonk, N.Y.

[21] Appl. No.: 881,297

[22] Filed: Jun. 24, 1997

Related U.S. Application Data

[63] Continuation of Ser. No. 634,996, Apr. 19, 1996, abandoned, which is a continuation of Ser. No. 324,847, Oct. 18, 1994, Pat. No. 5,675,500.

[51] Int. Cl.⁶ .................................................. G06F 17/50
[52] U.S. Cl. ........................ 364/490; 364/488; 364/489; 364/491; 364/578
[58] Field of Search ......................... 364/488, 489, 364/490, 491, 578; 395/500

[56] References Cited

PUBLICATIONS

Kunzar et al. "Cost Minimization of Partitions into Multiple Devices" 30th ACM/IEEE Design Aut. Conf., pp. 315–320, 1993.
Deng "An Investigation on Parasitic Couplings and Feedback Loops in the CMOS Circuits," IEEE, pp. 864–867.

*Primary Examiner*—Kevin J. Teska
*Assistant Examiner*—A. S. Roberts

[57] ABSTRACT

An efficient method for partitioning, for example, FPGA devices is described which optimizes the number of devices required to implement a design. The method involves generating a hierarchical graph of a feasible bipartition of the cells of the design. Feasible pairs are merged, followed by flattening of the hierarchical graph. The number of I/O pins of the new partition is then reduced, upon which a hierarchical graph is derived. A perturbed partition is then generated, followed by restoration of feasibility.

12 Claims, 3 Drawing Sheets

MULTI-CHIP DEVICE PARTITIONING PROCESS

This is a continuation of application Ser. No. 08/634,996, filed Apr. 19, 1996, now abandoned which is a continuation of U.S. Pat. application Ser. No. 08/324,847, filed Oct. 18, 1994 now U.S. Pat. No. 5,675,500.

BACKGROUND OF THE INVENTION

Designs for field programmable gate arrays ("FPGA") have grown from single chip applications to multi-chip implementations of large logic components. Hence, an efficient way (in terms of computer run-time) to determine an optimal partition of a large design using FPGA chips is of both theoretical and practical interest.

Numerous studies have been made on the subject of partitioning. In these prior art techniques, however, the cost function for minimization has usually been related to the cut of the resulting partition, with the cut being measured in terms of the resulting number of net connections among the segments. For the case of FPGA's, there are constraints on the number of cells and IO pins of each segment, (a segment being defined as a grouping of circuit elements, with each segment corresponding to a device in the finished product). Hence, the objective would be to minimize the number of segments, i.e., chips, required for the logic design.

One technique for minimizing the number of chips in the partitioning is described in R. Kuznar et al., "Cost Minimization of Partitions into Multiple Devices", pp. 315-320, Proc. 30th Design Automation Conf., 1993 ("Kuznar"). In Kuznar, the objective is to minimize the monetary cost of implementing a design using a library of Xilinx chips with given costs and capacities. The circuit to be implemented is iteratively bi-partitioned using the well-known Fiduccia-Mattheyses algorithm, into at least one feasible sub-circuit segment (one that can fit into a chip in the library) and a remainder. At each iteration, a lower bound of the cost function for implementing the remainder using the library is computed using a linear programming formulation. The choice of device type is determined by whether the remainder can be implemented by an element in the chip library, and if so, by the computed lower bound relative to the cost of the element.

It was proposed in Kuznar that instead of minimizing the traditional net cut set, the number of I/O pins should be the principal target of reduction. While minimizing the number of I/O pins is suitable for generating a reasonably good initial partitioning, it does not lead to the optimal number of segments in the general case. Consider the example shown in FIG. 1, which demonstrates the incompatibility of minimizing the number of I/O pins versus the number of chips. Let the target FPGA devices have a capacity of three cells and four I/O pins. The design is represented in FIG. 1(a). The six cells 2 cannot fit on a single device, as this would exceed the cell limit. Therefore, the design must be partitioned in some way in order to arrange the cells to fit them on devices having the given characteristics. It can be seen that the partition with the minimum number of I/O pins (zero in this case) is one with three segments, represented by rectangles 4, as shown in FIG. 1(b). Referring to FIG. 1(c), however, it can be seen that the design can also fit into two segments (represented by rectangles 3) each with three I/O pins. Therefore, simply minimizing the number of I/O pins is not sufficient to minimize the number of segments. The present invention provides a method for minimizing the number of segments.

Further, in Kuznar, the key idea is to use a linear programming formulation to select the mixture of device types yielding an optimum cost. The present invention, on the other hand, focusses on a single device type and employs a novel multi-step partitioning process to optimize the number of chips required for implementation, greatly reducing the cost of circuit design and construction.

SUMMARY OF THE INVENTION

The present invention is a method for minimizing the number of segments in a partitioning of a design using one or more FPGA chips with like cell capacity and I/O pin limits.

FIGURES

DETAILED DESCRIPTION

In the present invention, a design network is initially modeled by a hypergraph $H=\{V,E\}$, where V is a set of nodes and E is a set of nets. V consists of a set of internal nodes, X, that corresponds to the FPGA cells and a set of terminal nodes, Y, that corresponds to the primary I/O's of the network. Each net is represented by the set of nodes that the net is connected to. A k-way partitioning of H is an assignment of the nodes in V into k hypergraphs $S_j$, where $S_j=\{\{X_j, Y_j\}, E_j\}$, such that $$\cup_i X_i = X, \quad \cup_i Y_i \supseteq Y, \text{ and } X_i \cap X_j = \Phi.$$

An I/O pin is required for net e in segment $S_1$ if and only if $e \cap V_1 \neq \phi$ and $e \not\subseteq V_i$, in which case the net belongs to the cut set of the partition. An I/O pin is required in segment $S_i$ for each terminal node in $S_i$. Let the target FPGA device have a capacity of N cells and P I/O pins. A segment $S_j$ is cell-feasible if and only if the cardinality of $X_j$, $|X_j|$, is less than or equal to the device capacity N. A segment $S_j$ is I/O-feasible if and only if the number of I/O pins $C_j$ is less than or equal to P, the pin-limit. A segment $S_j$ is feasible if and only if it is both cell-feasible and I/O-feasible. A partitioning is feasible if and only if all its segments are feasible. The objective of the FPGA partitioning problem, as used in the present invention, is to find a feasible partitioning with the minimum number of segments. This is in contrast to the traditional partitioning objective of minimizing the size of the net cut set. Heretofore, there has been no local minimization algorithm which will lead to a minimal number of segments.

The problem of partitioning a large design into FPGA devices requires a different approach than the standard k-way partitioning problem. In the standard k-way partitioning problem, the starting point can be any randomly chosen k segments and then the cut set is reduced by a Fiduccia-Mattheyses type algorithm. One example of a Fiduccia-Mattheyses algorithm is described in "A Linear-Time Heuristic For Improving Network Partitions", by C. M. Fiduccia and R. M. Mattheyses. For the FPGA problem there is no a priori knowledge of the minimum number of devices into which the design can fit. The starting point, therefore, is to find an initial feasible partitioning for the circuit. Since it is very unlikely that an arbitrary partitioning is feasible, an initial feasible partition is generated by construction, as in the following paragraph.

Figure 3:
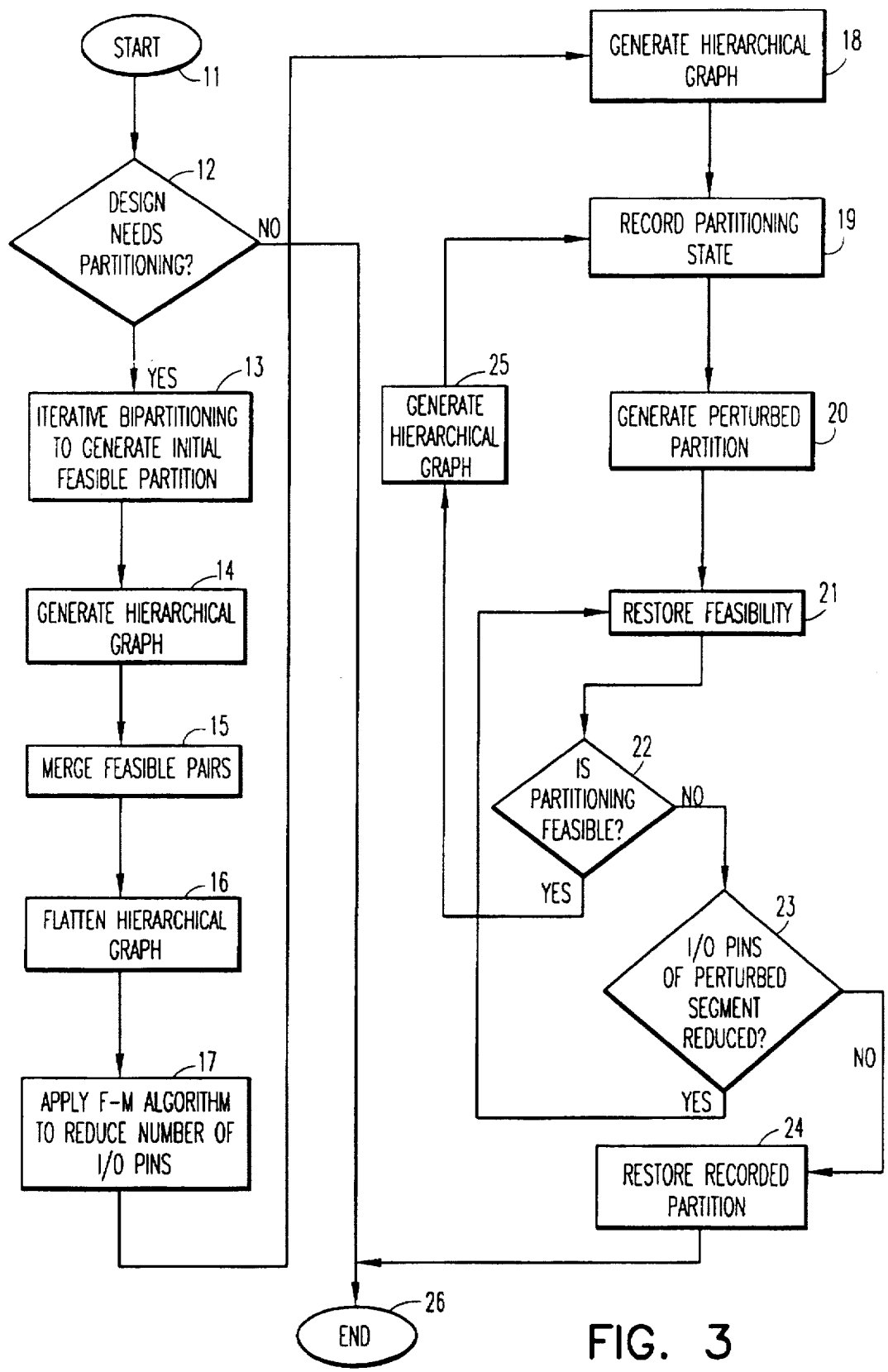
FIG. 3 is a flow chart describing the method of the present invention.

The method of the invention will now be described with reference to FIG. 3. It is first determined in block 12 whether partitioning of the circuit is necessary. Again, partitioning is required if the cell or I/O pin limits of the available devices would be exceeded. In the step 13, circuit C is bi-partitioned into a feasible segment and a remainder. The process is iteratively applied to the remainder until at some stage both the segment and the remainder are feasible. Initially, the remainder is the entire circuit, i.e., $R_0=C$. At the $j^{th}$ iteration, the remainder circuit $R_j$, is bi-partitioned into $S_j$ and $R_j$, where $S_j$ is feasible. The feasible segment is generated as follows. At the beginning of the $j^{th}$ iteration, $S_j$ is empty. For each cell in $R_{j-1}$, the penalty function, namely, the number of I/O pins generated in both $S_j$ and $R_{j-1}$ if the cell is moved from $R_{j-1}$ to $S_j$, is computed. A sequence of $S_j$ is generated by moving cells from $R_{j-1}$ to $S_j$ in ascending order of the cell's penalty function until the number of internal cells of $S_j$ reaches the device capacity, N. The resulting $S_j$ is chosen to be the feasible segment with the largest number of cells in this sequence. What remains of $R_{j-1}$ becomes $R_j$, for the next iteration.

Figure 1A:
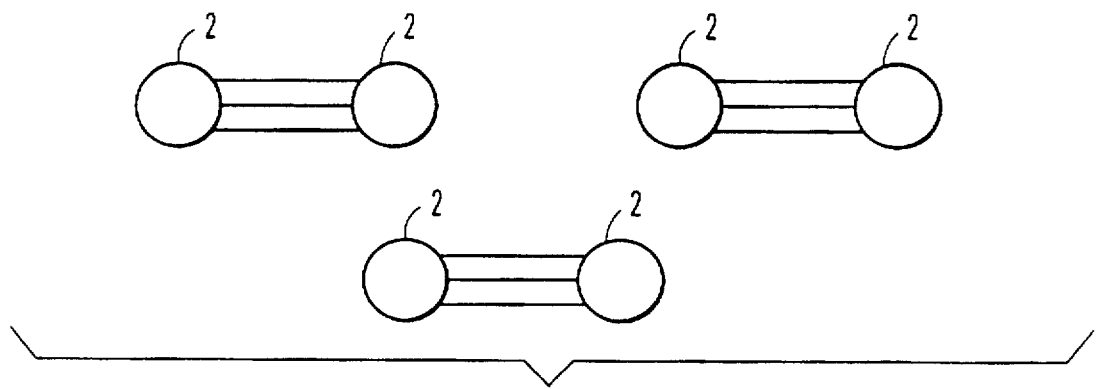
FIG. 1 is a series of diagrams depicting the partitioning of a circuit design for implementing a design with a set of device-specific characteristics.
Figure 1B:
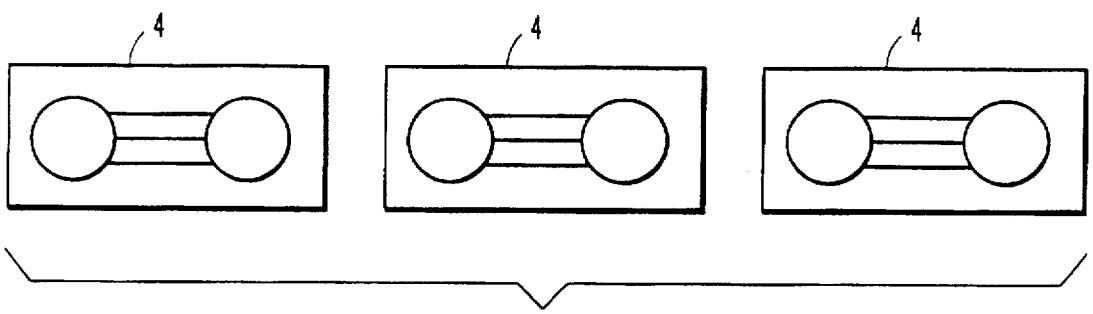
Figure 1C:
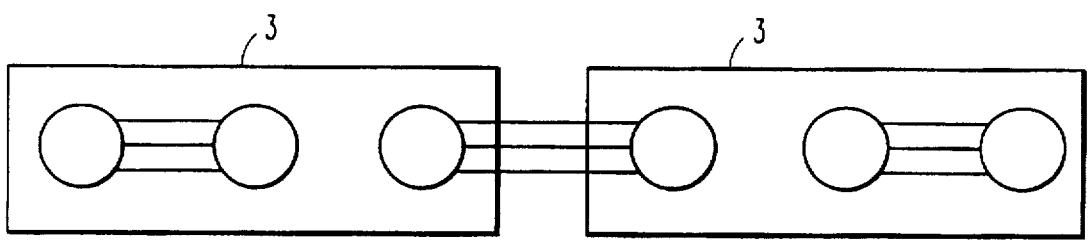
Figure 2B:
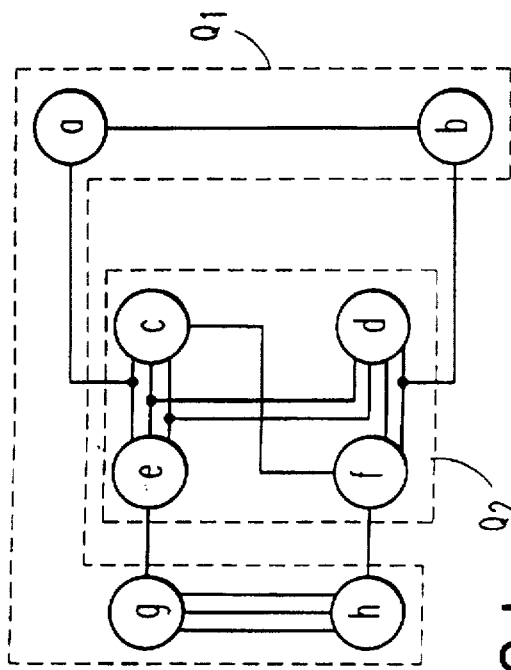
FIG. 2 is a schematic of the steps of partitioning a circuit.
Figure 2D:
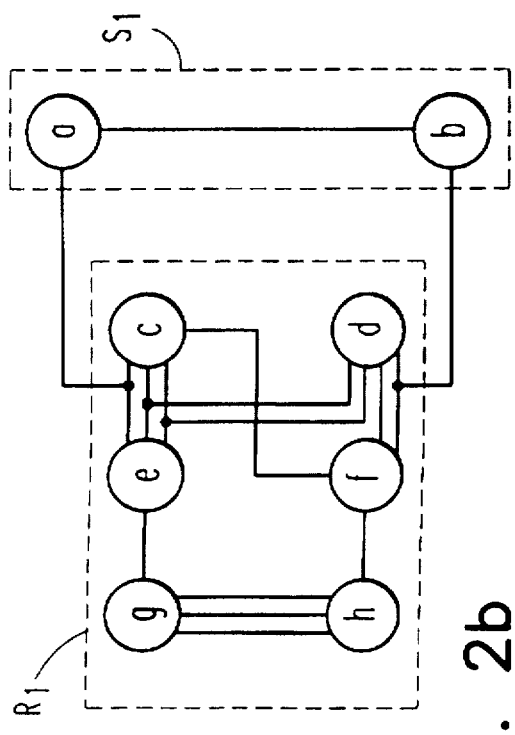
Figure 2A:
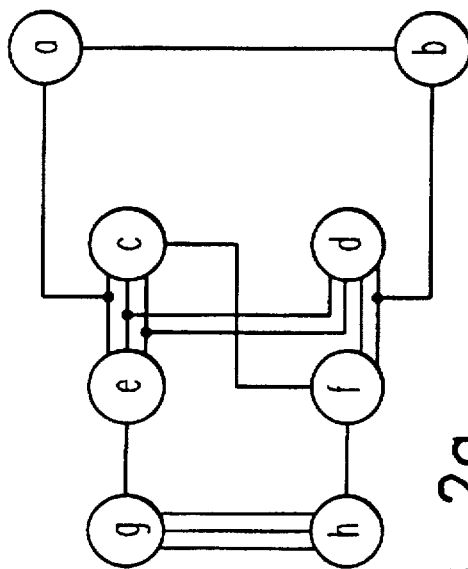
Figure 2C:
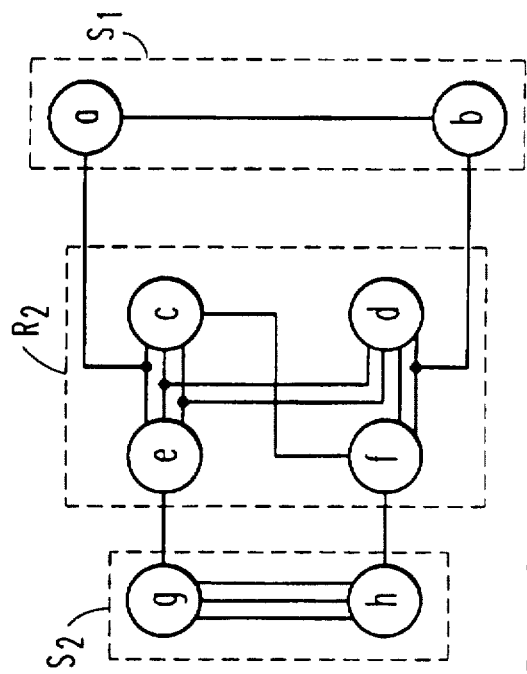

The foregoing steps are illustrated in the following example in which the initial circuit is represented by the schematic in FIG. 2 and the target FPGA device has a capacity of four cells and four I/O pins. Using the bi-partitioning iteration described above, $S_1$ will contain a and b, and $R_1$ will contain c, d, e, f, g and h. FIG. 2(b). Performing another partitioning iteration will yield $S_2$ containing g and h and $R_2$ containing c, d, e and f. The resulting partition consists of three segments, $S_1$, $S_2$ and $R_2$, as shown in FIG. 2(c). However, the circuit could also be fit into just two segments: $Q_1$ containing a, b, g and h; and $Q_2$, containing c, d, e and f. FIG. 2(d). The following steps will describe a method for achieving the segment optimization of FIG. 2(d).

Returning now to FIG. 3, the following steps focus on a preferred approach, in accordance with the invention, for reducing the number of segments generated by the bi-partitioning iteration of block 13, described above. It will be understood that two feasible segments are mergeable if and only if combining the two segments results in a feasible segment. The bi-partitioning iteration does not guarantee that the resulting segments are mutually unmergeable.

In accordance with the invention, a hierarchy graph similar to the one in FIG. 2(c) is built, step 14, except that the segments themselves are treated as nodes (e.g., $S_1$, $S_2$ and $R_2$ of FIG. 2(c) are treated as nodes). An exhaustive pairwise merging technique is then applied to the hierarchy graph in order to merge the feasible pairs, step 15. Applying step 15 to FIG. 2(c), segments $S_1$ and $S_2$ will be combined into segment Q, of FIG. 2(d). More sophisticated algorithms, like the binate cover algorithm, could be employed to locate the mergeable segments. At this stage however, only a small percentage of mergeable segments should be present and a pairwise merging algorithm should be adequate.

After all the mergeable segments are merged, the hierarchical graph is flattened; that is, the hierarchical graph is transformed into one in which the cells again constitute the nodes. FIG. 3, step 16. This involves merely ungrouping the segments which were merged, leaving only cells within their merged groupings. Using the partitioning assignment derived from the hierarchical graph as an initial partition, the F-M algorithm is applied to the flattened graph to reduce the number of I/O pins. FIG. 3, step 17. A perturbation-relaxation technique is then applied, to further reduce the number of segments as now described.

The I/O pin to cell capacity ratio of most FPGA devices is such that the partitioning problem is usually limited by I/O, rather than cell capacity. Thus, as cells are being packed into a segment, the I/O pins required reaches the device limit well before the number of cells reaches the cell capacity, so that the cell utilization percentage (i.e., the percentage of all available cells in the segment which are actually used) is usually low.

However, two feasible segments are cell-mergeable if and only if combining the two segments results in a cell-feasible segment, and two feasible segments are I/O-mergeable if and only if combining the two segments results in an I/O-feasible segment. It follows from the preceding discussion, therefore, that given a feasible partitioning, it is quite likely that there exist a number of cell-mergeable pairs, although they may not be I/O mergeable.

The I/O excess of a cell-feasible segment is the number of I/O pins the segment has in excess of the pin limit. The I/O surplus of a feasible segment is the pin limit minus the number of I/O pins in the segment. A perturbed segment is defined herein to be a cell-feasible segment whose I/O excess is less than 20 percent of the pin limit.

A perturbed partition is a partition which contains one perturbed segment, with the remaining segments each being feasible. The I/O slack of a perturbed partition is the sum of the I/O surplus of all its feasible segments minus the I/O excess of the perturbed segment. Intuitively, the probability that a perturbed partition can be rendered feasible increases with the magnitude of its I/O slack. Given a feasible partition, the strategy is to merge the cell-mergeable pair of segments which would result in a perturbed partition with the largest I/O slack. The location of the optimal cell-mergeable pair is performed on the hierarchical graph derived from the pre-perturbed partition. The resulting hierarchical graph representing the perturbed partition is then made feasible by a relaxation process, to be described in detail below, with the assumption that the perturbed partition selected has the highest probability of success. While the I/O slack provides a heuristic guideline for selecting a good candidate, there is no guarantee that the selected perturbed partition can be made feasible.

Attention is now focused on the relaxation process in which the attempt is made to recover feasibility for the perturbed partition. A conventional k-way Fiduccia-Mattheyses cut reduction algorithm, which reduces the number of pins over all segments, is not effective here. The objective here is to reduce the number of pins of the perturbed segment down to the pin limit, but at the same time maintaining the feasibility of the rest of the segments. The number of pins of the perturbed segment can be reduced at the expense of increasing the number of pins of the rest of the partition. The total number of pins required for the entire partition might very well increase as a result.

A method for achieving I/O pin reduction (i.e., relaxation) for the perturbed segment (step 21 of FIG. 3) is now described. The hierarchical graph representing the perturbed partition is flattened so that any cell is again a node. The cost function used for the relaxation process should encourage movements of nodes from one segment to another, namely moves, that directly reduce the number of I/O pins on the perturbed segment. Such moves, however, have a high probability of increasing the number of I/O pins of the other feasible segments. In order to avoid trapping the solution in local minima, moves that do not involve the perturbed segment, but which improve the number of global I/O pins, must be considered. In accordance with the invention, a cost function is introduced that implements this strategy.

Let U be the upper bound of the change in the number of I/O pins for each move in the perturbed partition. The upper bound is the maximum change in I/O pins that is possible for any move, given the perturbed partition of the flattened graph. Let the perturbed segment be segment p, and let $q(v,i,j)$ be the number of pins reduced from the perturbed segment if node v is moved from segment i to segment j if either i=p or j=p. If neither i=p nor j=p, $q(v,i,j)=0$. Let $g(v,i,j)$ be the number of I/O pins reduced in the entire partition if node v is moved from segment i to segment j. The cost function, therefore, is defined to be:

$$C=k*U*q(v,i,j)+g(v,i,j)$$

where k is a constant which controls the priority given to moves that reduce the I/O pins of the perturbed segment versus moves that reduce the global I/O pins. If $k \leq 2$, moves that improve the I/O pin count of the perturbed segment take complete precedence.

A sequence of moves is made in descending order of the cost function. Moves are restricted to legal ones, i.e., those that do not render any feasible segment infeasible. Moreover, a move of node v from segment i to segment j is locked if v has been moved to j before. The move sequence terminates when all moves are either illegal or are in the lock state. The result partition is the one in the sequence in which the perturbed segment has the least number of pins if the perturbed segment is still infeasible. If the perturbed segment has become feasible, the result partition is the one that has the largest I/O slack in the sequence.

The perturbation-relaxation step of the partitioning process is summarized as follows. First, a hierarchical graph of the result of the pin-reduction technique is generated, FIG. 3, step 18. Next, the partitioning state, i.e., the assignment of segments to nodes, is recorded before the perturbed partition is formed, step 19. Next, a perturbed partition is generated in the following manner FIG. 3, step 20. A cell-feasible pair of segments is selected for merging to form a perturbed segment based on the I/O slack of the resulting perturbed partition. That is, the merge (from among all possible merges) that results in the greatest I/O slack will be chosen. The relaxation technique is then applied iteratively to restore the feasibility of the perturbed partition, FIG. 3, block 21.

In the next step 22, it is determined whether the partitioning arrived at in the preceding steps is feasible. If so, then steps 19–21 and 24 are repeated in an attempt to form a better partitioning after first generating a new hierarchical graph. If not, it is determined whether the number of I/O pins in the perturbed segment was reduced in a preceding step, FIG. 3, step 23. If so, steps 21 and 22 are repeated. If not, the partition recorded in step 19 is restored, step 24, and the process ends 26. The number of segments id reduced to the lowest quantity feasible and cost is thereby reduced as well. In addition, a cost function is introduced to compare relative costs during the partitioning process based on, for example reduced number of device pins. This being the case the circuit is considered optimized according to the present invention by reducing the number of segments and cost thereof.

While the invention has been described particularly with respect to its application to FPGA's, it will be understood that the disclosed process is equally applicable to the design of any other device in which partitioning is desired.

We claim:

1. A method for constructing an integrated circuit with a near optimum number of devices, the circuit comprising a plurality of cells, the method comprising the computer implemented steps of:

(a) iteratively bi-partitioning the circuit to generate an initial feasible partition of the cells of the circuit;

(b) generating a hierarchical graph of the initial partition;

(c) pair-wise merging feasible segments of the hierarchical graph;

(d) flattening the hierarchical graph after the merging;

(e) generating a new partition with a reduced number of I/O pins;

(f) creating a new hierarchical graph based upon the partition in (e);

(g) recording the partitioning state of the hierarchical graph;

(h) forming a perturbed partition by merging a perturbed segment of the hierarchical graph with one or more other segments of the hierarchical graph;

(I) relaxing the perturbed partition to make it feasible;

(j) repeating steps (g)–(I) until optimized by reducing the number of segments and a cost of the circuit;

(k) constructing the circuit with devices partitioned in accordance with the foregoing steps.

2. The method of claim 1, wherein the iterative partitioning is performed using a Fiduccia-Mattheyses algorithm.

3. The method of claim 1, wherein the number of I/O pins is reduced using a Fiduccia-Mattheyses algorithm.

4. The method of claim 1, wherein the devices are field programmable gate arrays (FPGA).

5. The method of claim 4, wherein the FPGA's each have a like cell limit and a like input-output pin limit.

6. The method of claim 1, wherein the step of relaxing the perturbed partition comprises:

flattening the hierarchical graph that represents the perturbed partition;

determining a cost for each possible move of a node from one segment to another segment, wherein the cost reflects a change in the number of device pins reduced from the perturbed segment and the number of device pins reduced in the entire partition; and repeatedly moving nodes from one segment to another in descending order of cost to reduce the number of device pins to a feasible level until no more moves can be accomplished.

7. The method of claim 1, wherein the step of merging cells in the new hierarchical graph to form a perturbed partition comprises:

determining from among all possible segment merges a merge which will result in a perturbed segment and which will maximize the I/O slack of the resulting partition.

8. The method of claim 1, wherein the perturbed partition comprises a single perturbed segment.

9. The method of claim 1, wherein relaxing the perturbed partition comprises:

iteratively moving cells between segments in descending order of a cost function.

10. The method of claim 9, wherein the cost function is defined as:

$$C=k*U*q(v,i,j)+g(v,i,j),$$

where C is the cost, K is a constant controlling priority given to moves that reduce I/O pins of the perturbed segment versus moves that reduce global I/O pins, U is an upper bound of the change in the number of I/O pins of the perturbed partition for each move, q(v,i,j) is the number of I/O pins reduced from a perturbed segment p if cell v is moved from segment i to segment j if either i=p or j=p and is zero otherwise, and g(v,i,j) is the number of I/O pins reduced in the entire partition if node v is moved from segment i to segment j.

11. The method of claim 1, wherein the step of generating a new partition is accomplished using a Fiduccia-Mattheyses algorithm.

12. A method for constructing an integrated circuit with a near optimum number of devices, the circuit comprising a plurality of cells, the method comprising the computer implemented steps of:

iteratively bi-partitioning the circuit to generate an initial feasible partition of the cells of the circuit;

generating a hierarchical graph of the initial partition;

pair-wise merging feasible segments of the hierarchical graph;

flattening the hierarchical graph after the merging;

generating a new partition with a reduced number of I/O pins; and constructing the circuit with devices partitioned in accordance with the foregoing steps.

* * * * *